United States Patent
Carter

(10) Patent No.: US 10,900,412 B2
(45) Date of Patent: Jan. 26, 2021

(54) ELECTRONICS ASSEMBLY HAVING A HEAT SINK AND AN ELECTRICAL INSULATOR DIRECTLY BONDED TO THE HEAT SINK

(71) Applicant: BORGWARNER INC., Auburn Hills, MI (US)

(72) Inventor: Jeffrey Carter, West Yorkshire (GB)

(73) Assignee: Borg Warner Inc., Auburn Hills, MI (US)

( * ) Notice: Subject to any disclaimer, the term of this patent is extended or adjusted under 35 U.S.C. 154(b) by 231 days.

(21) Appl. No.: 15/993,747

(22) Filed: May 31, 2018

(65) Prior Publication Data
US 2019/0368413 A1    Dec. 5, 2019

(51) Int. Cl.
*F02B 39/00* (2006.01)
*H05K 7/20* (2006.01)
(Continued)

(52) U.S. Cl.
CPC ............ *F02B 39/005* (2013.01); *F02B 39/10* (2013.01); *F02M 35/10157* (2013.01);
(Continued)

(58) Field of Classification Search
CPC .............. H01L 23/473; H05K 7/20872; H05K 7/20927
See application file for complete search history.

(56) References Cited

U.S. PATENT DOCUMENTS

| 5,870,894 A * | 2/1999 | Woollenweber ...... F02B 37/005 417/407 |
| 6,588,647 B2 * | 7/2003 | Yamada ............. H05K 7/20872 165/170 |

(Continued)

FOREIGN PATENT DOCUMENTS

| EP | 2163747 A1 | 3/2010 |
| EP | 3293866 A1 | 3/2018 |

(Continued)

OTHER PUBLICATIONS

Machine-assisted English language abstract and machine-assisted English translation for EP 3 293 866 extracted from espacenet.com database on Sep. 23, 2019, 11 pages.

(Continued)

*Primary Examiner* — Robert J Hoffberg
(74) *Attorney, Agent, or Firm* — Howard & Howard Attorneys PLLC

(57) ABSTRACT

An electronics assembly drives an electric motor and receives a coolant fluid. The electronics assembly includes a heat sink including a thermally conductive material. The heat sink includes a frame extending between a first surface and a second surface. The first surface defines at least a portion of a cavity for receiving the coolant fluid therein. The heat sink includes a plurality of cooling members coupled to and extending from the first surface of the frame into the cavity such that the plurality of cooling members are disposed within the coolant fluid. The electronics assembly further includes an electrical insulator directly bonded to the second surface of the frame and a semiconductor thermally coupled to the electrical insulator. The electrical insulator is a thermal conductor and facilitates heat transfer between the semiconductor and the heat sink. The electrical insulator electrically insulates the semiconductor from the heat sink.

24 Claims, 11 Drawing Sheets

(51) Int. Cl.
| | |
|---|---|
| *H01L 23/473* | (2006.01) |
| *H05K 1/02* | (2006.01) |
| *F02M 35/10* | (2006.01) |
| *F02B 39/10* | (2006.01) |
| *H02K 9/00* | (2006.01) |
| *H02K 9/22* | (2006.01) |

(52) U.S. Cl.
CPC .......... *H01L 23/473* (2013.01); *H02K 9/005* (2013.01); *H02K 9/22* (2013.01); *H05K 1/0203* (2013.01); *H05K 7/2039* (2013.01); *H05K 7/20218* (2013.01); *H05K 7/20254* (2013.01); *H05K 7/20872* (2013.01); *H05K 7/20927* (2013.01); *F05D 2220/40* (2013.01); *F05D 2260/22141* (2013.01)

(56) References Cited

U.S. PATENT DOCUMENTS

| | | | | |
|---|---|---|---|---|
| 6,594,149 B2* | 7/2003 | Yamada | ............ | H05K 7/20872 165/170 |
| 7,425,119 B2 | 9/2008 | Bolz | | |
| 7,543,457 B2* | 6/2009 | Crocker | ............ | F04D 29/588 165/104.33 |
| 7,851,707 B2* | 12/2010 | Mizutani | ............ | H05K 1/024 174/254 |
| 8,198,540 B2* | 6/2012 | Kuromitsu | .......... | H01L 23/3735 165/185 |
| 8,232,637 B2 | 7/2012 | Beaupre et al. | | |
| 8,472,188 B2* | 6/2013 | Horiuchi | ............ | H05K 7/20927 165/80.4 |
| 8,637,979 B2* | 1/2014 | Miyamoto | .......... | H01L 23/4006 257/712 |
| 8,730,672 B2 | 5/2014 | Ebersberger et al. | | |
| 8,872,328 B2 | 10/2014 | Delgado et al. | | |
| 8,872,332 B2 | 10/2014 | Uhlemann et al. | | |
| 8,882,478 B2* | 11/2014 | Shimizu | ............ | F02B 37/10 123/559.1 |
| 8,927,873 B2* | 1/2015 | Hori | ............ | H01L 21/4878 174/252 |
| 9,013,877 B2* | 4/2015 | Harubeppu | ............ | H01L 23/34 361/702 |
| 9,324,896 B2* | 4/2016 | Gaynes | ............ | H01L 31/052 |
| 9,412,891 B2* | 8/2016 | Gaynes | ............ | H01L 31/052 |
| 9,520,305 B2 | 12/2016 | Kulas | | |
| 9,578,789 B2* | 2/2017 | Uhlemann | ............ | H02M 7/003 |
| 9,655,294 B2* | 5/2017 | Loong | ............ | H05K 13/00 |
| 9,673,129 B2* | 6/2017 | Hori | ............ | H01L 25/07 |
| 9,681,580 B2* | 6/2017 | Loong | ............ | H01L 21/4878 |
| 9,795,057 B2* | 10/2017 | Reeves | ............ | H01L 21/4878 |
| 9,812,377 B2* | 11/2017 | Yamada | ............ | H01L 25/072 |
| 10,197,020 B2* | 2/2019 | Carter | ............ | F02M 35/10157 |
| 10,249,553 B2* | 4/2019 | Ninomiya | ............ | H01L 23/473 |
| 10,319,665 B2* | 6/2019 | Maruyama | ............ | H01L 23/473 |
| 10,531,594 B2* | 1/2020 | Reeves | ............ | H05K 7/20254 |
| 10,537,042 B2* | 1/2020 | Fan | ............ | G06F 1/20 |
| 2004/0055152 A1 | 3/2004 | Fraivillig | | |
| 2006/0039127 A1 | 2/2006 | West | | |
| 2010/0206537 A1* | 8/2010 | Ikeda | ............ | H01L 23/3735 165/185 |
| 2015/0008574 A1* | 1/2015 | Gohara | ............ | H01L 23/473 257/714 |
| 2015/0097281 A1* | 4/2015 | Adachi | ............ | H01L 23/473 257/714 |
| 2015/0380338 A1* | 12/2015 | Hori | ............ | H01L 25/07 257/693 |
| 2016/0195047 A1* | 7/2016 | Carter | ............ | F02M 35/10157 60/605.1 |
| 2017/0117208 A1 | 4/2017 | Kasztelan et al. | | |
| 2017/0271239 A1 | 9/2017 | Morozumi et al. | | |

FOREIGN PATENT DOCUMENTS

| | | | | |
|---|---|---|---|---|
| WO | 2007091976 A1 | 8/2007 | | |
| WO | WO-2014171276 A1 * | 10/2014 | ......... | H01L 23/3675 |
| WO | 2014210093 A1 | 12/2014 | | |
| WO | 2016130773 A1 | 8/2016 | | |

OTHER PUBLICATIONS

International Search Report for Application No. PCT/US2019/033229 dated Sep. 16, 2019, 4 pages.
CPS Technologies, "Website and AlSiC Metal Matrix Composites for Power Electronics", www.alsic.com, 2018, 7 pages.
GAN Systems, "GS66508P-650V Enhancement Mode GaN Transistor", http://gansystems.com/stepfiles/GS66508P.STEP, Jan. 2018, 3 pages.
Grabcad, "SOIC Package Narrow 8,10,14 and 16 Pins", https://grabcad.com/library/soic-package-narrrow-8-10-14-and-16-pins-1, Jan. 2018, 6 pages.
Grabcad, "SOT 23-Spin", https://grabcad.com/library/sot-23-5pin, Jan. 2018, 4 pages.
Lu, J. et al., "A High Power-Density and High Efficiency Insulated Metal Substrate Based GaN HEMT Power Module", ECCE Conference, Sep. 2017, 5 pages.
NCAB Group, "Seminar No. 7: Insulated Metal Substrate", 2018, 86 pages.
Taiyo Kogyo, Aluminum Base PCB, http://www.atn.ne.jp/~pcbtaiyo/pwb-a.html, 2018, 1 page.
Wikipedia, "Die (Integrated Circuit)", downloaded from https://en.wikipedia.org/wiki/Die_(integrated_circuit) on Feb. 14, 2018, 3 pages.
Wikipedia, "Dielectric", downloaded from https://en.wikipedia.org/wiki/Dielectric on Feb. 14, 2018, 12 pages.

* cited by examiner

US 10,900,412 B2

ELECTRONICS ASSEMBLY HAVING A HEAT SINK AND AN ELECTRICAL INSULATOR DIRECTLY BONDED TO THE HEAT SINK

BACKGROUND OF THE INVENTION

1. Field of the Invention

The subject invention generally relates to an electronics assembly for driving an electric motor and configured to receive a coolant fluid for cooling the electronics assembly.

2. Description of the Related Art

Turbochargers receive exhaust gas from an internal combustion engine and deliver compressed air to the internal combustion engine. Turbochargers are used to increase power output of the internal combustion engine, lower fuel consumption of the internal combustion engine, and reduce emissions produced by the internal combustion engine. Delivery of compressed air to the internal combustion engine by the turbocharger allows the internal combustion engine to be smaller, yet able to develop the same or similar amount of horsepower as larger, naturally aspirated internal combustion engines. Having a smaller internal combustion engine for use in a vehicle reduces the mass and aerodynamic frontal area of the vehicle, which helps reduce fuel consumption of the internal combustion engine and improve fuel economy of the vehicle.

In recent years, automotive companies have attempted to further increase the efficiency of the turbocharger and, in turn, the internal combustion engine to improve fuel efficiency. Specifically, in addition to the turbocharger, automotive companies have also included an electric motor that assists in delivering compressed air to the internal combustion engine.

Traditionally, electric motors include high power density electronics for driving the electric motor. However, packaging requirements often limit the circuit board area for these higher power level electronics. The limited circuit board area makes it difficult to dissipate heat from the high power density electronics.

Heat sinks have been mounted to the circuit boards having high power density electronics; however, the circuit boards and the heat sinks have air gaps between them, which reduces the thermal conductivity efficiency between the circuit boards and the heat sinks. Thermal grease has been added between the circuit board and the heat sink to improve the thermal conductivity efficiency; however, the grease is messy to apply, is viscous and capable of moving out of desired locations, and degrades over time. As such, there remains a need for an improved electronics assembly for driving an electric motor.

SUMMARY OF THE INVENTION AND ADVANTAGES

The subject invention provides for an electronics assembly for driving an electric motor and configured to receive a coolant fluid for cooling the electronics assembly. The electronics assembly comprises a heat sink comprising a thermally conductive material. The heat sink comprises a frame extending between a first surface and a second surface, wherein the first surface defines at least a portion of a cavity for receiving the coolant fluid therein. The heat sink further comprises a plurality of cooling members coupled to and extending from the first surface of the frame into the cavity such that the plurality of cooling members are disposed within the coolant fluid in the cavity and heat can be transferred between the heat sink and the coolant fluid. The electronics assembly further comprises an electrical insulator directly bonded to the second surface of the frame, wherein the electrical insulator is a thermal conductor, and a semiconductor thermally coupled to the electrical insulator to facilitate heat transfer between the semiconductor and the heat sink. The electrical insulator electrically insulates the semiconductor from the heat sink.

Accordingly, the electronics assembly improves heat dissipation through the direct bonding of the electrical insulator to the second surface of the frame. More specifically, the direct bonding reduces thermally insulating air gaps between the electrical insulator and the second surface of the frame, which increases the thermal transfer efficiency of the electronics assembly. In addition, the direct bonding of the electrical insulator to the second surface of the frame reduces cost and increases throughput by eliminating the need for a separately produced electrically insulating board, which is then mounted to a heat sink with thermal grease therebetween. Furthermore, the direct bonding of the electrical insulator to the second surface of the frame allows for thin layers of the electrical insulator, which reduces the size of the electronics assembly and improves the packaging characteristics of the electronics assembly.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
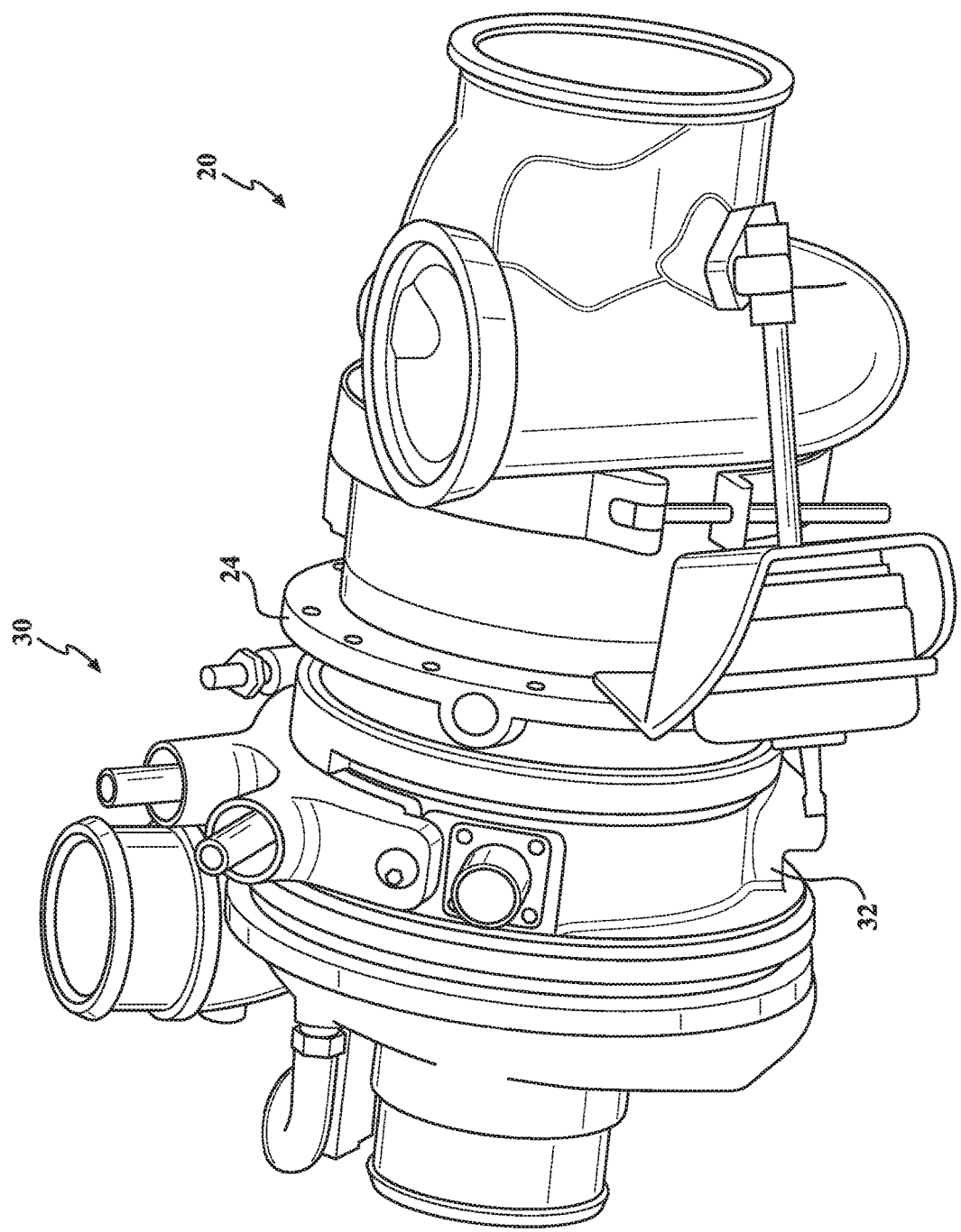
FIG. 1 is a perspective view of a motorized forced-induction system and a turbocharger forming a single component in an assisted turbocharger system.
Figure 2:
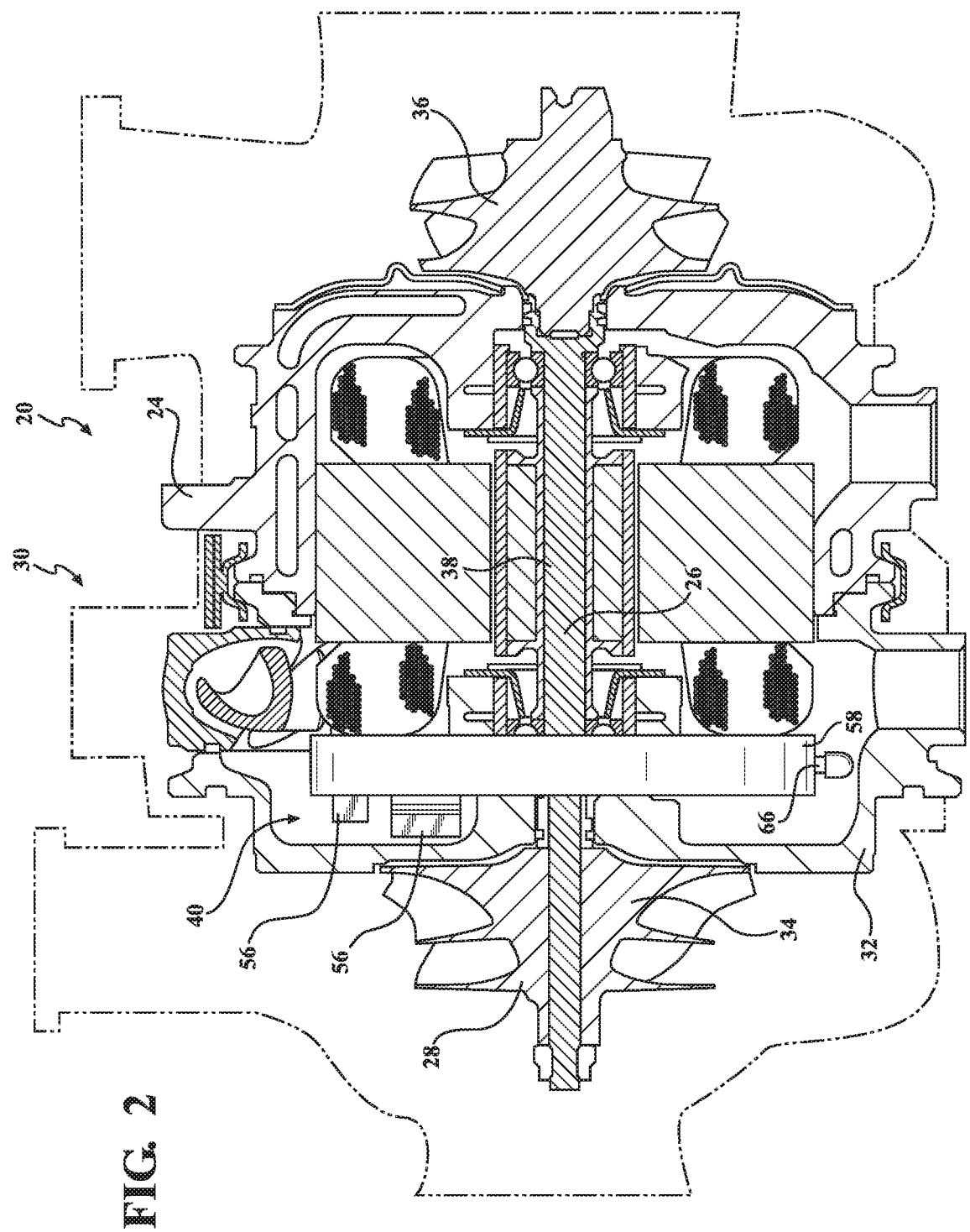
FIG. 2 is a cross-sectional view of the assisted turbocharger system shown in FIG. 1.
Figure 3:
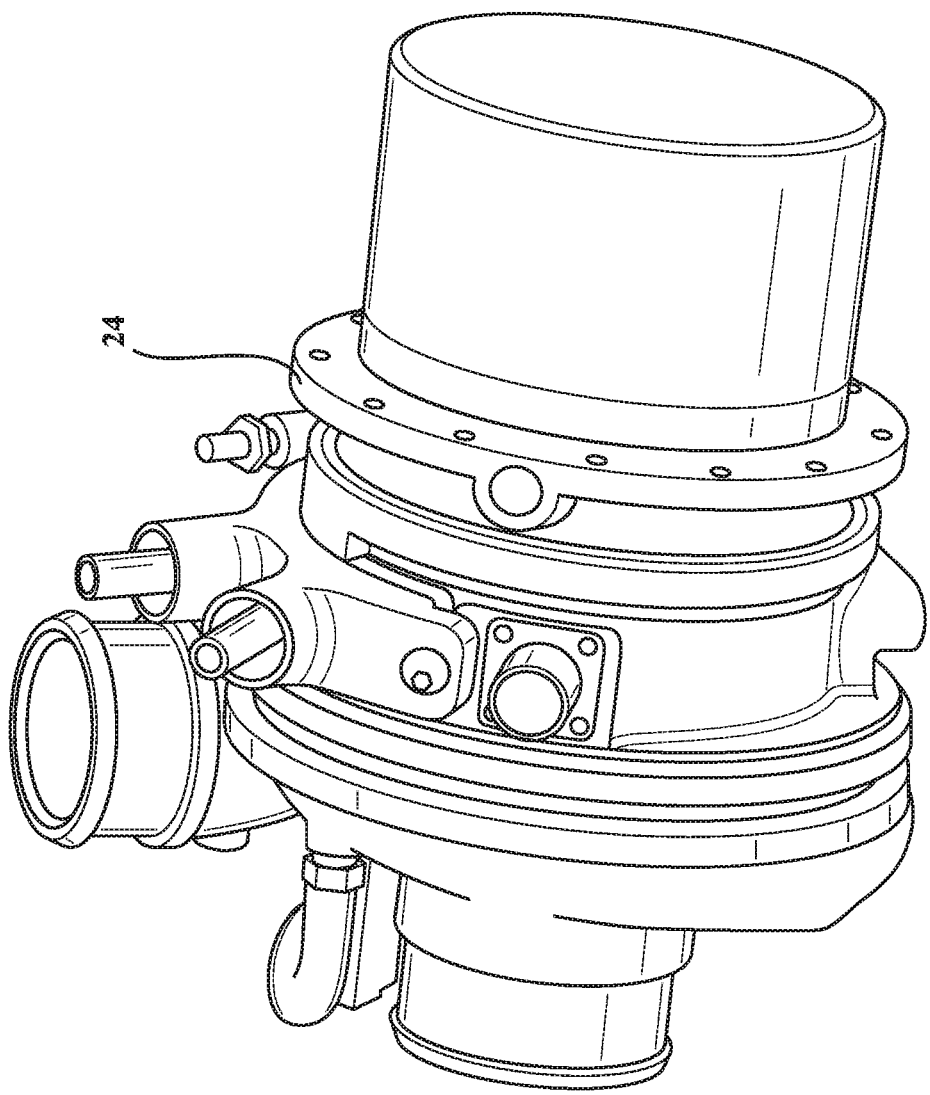
FIG. 3 is a perspective view of a motorized forced-induction system as a component separate from a turbocharger in an assisted turbocharger system.
Figure 4:
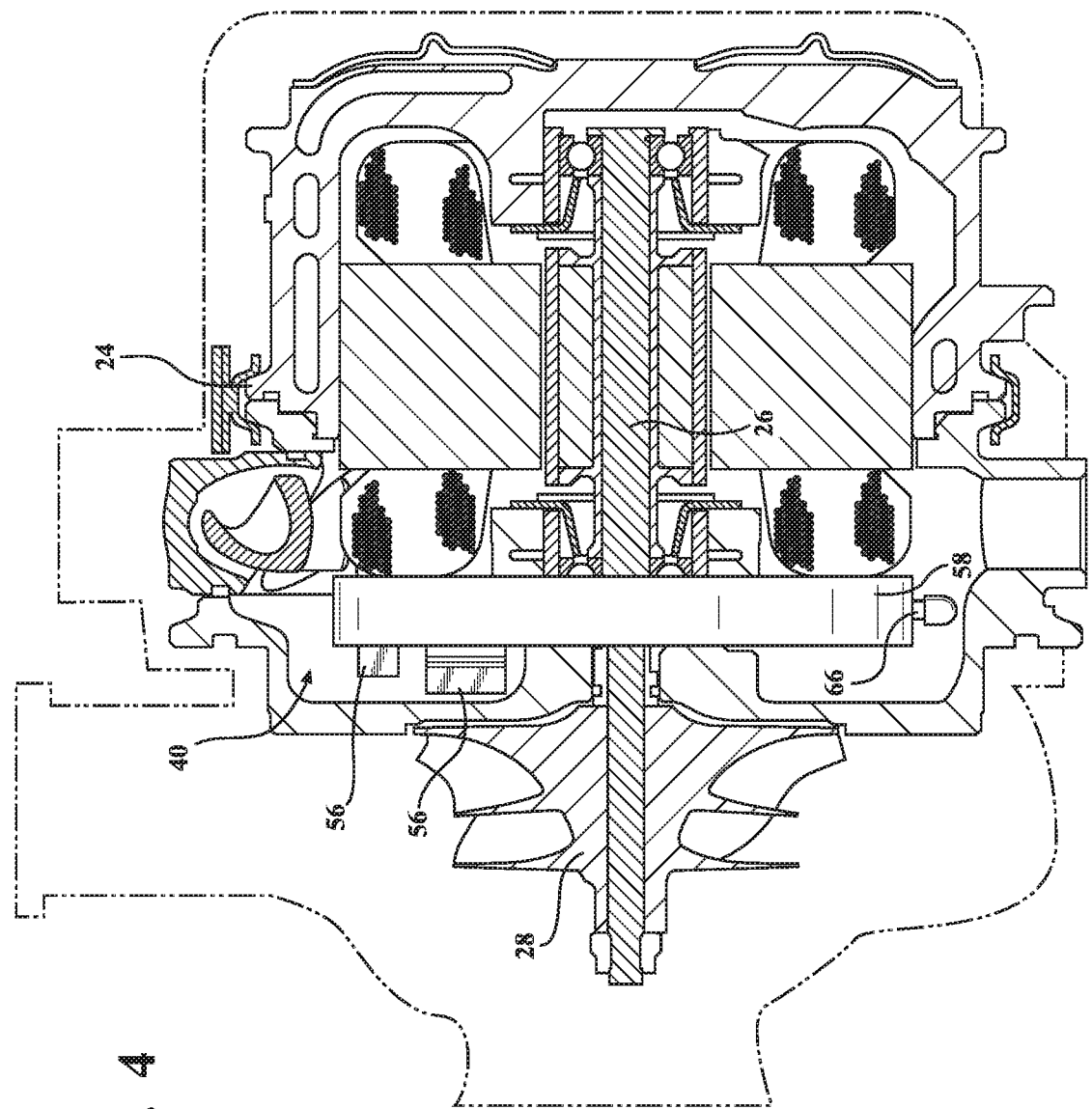
FIG. 4 is a cross-sectional view of the motorized forced-induction system shown in FIG. 3.
Figure 5:
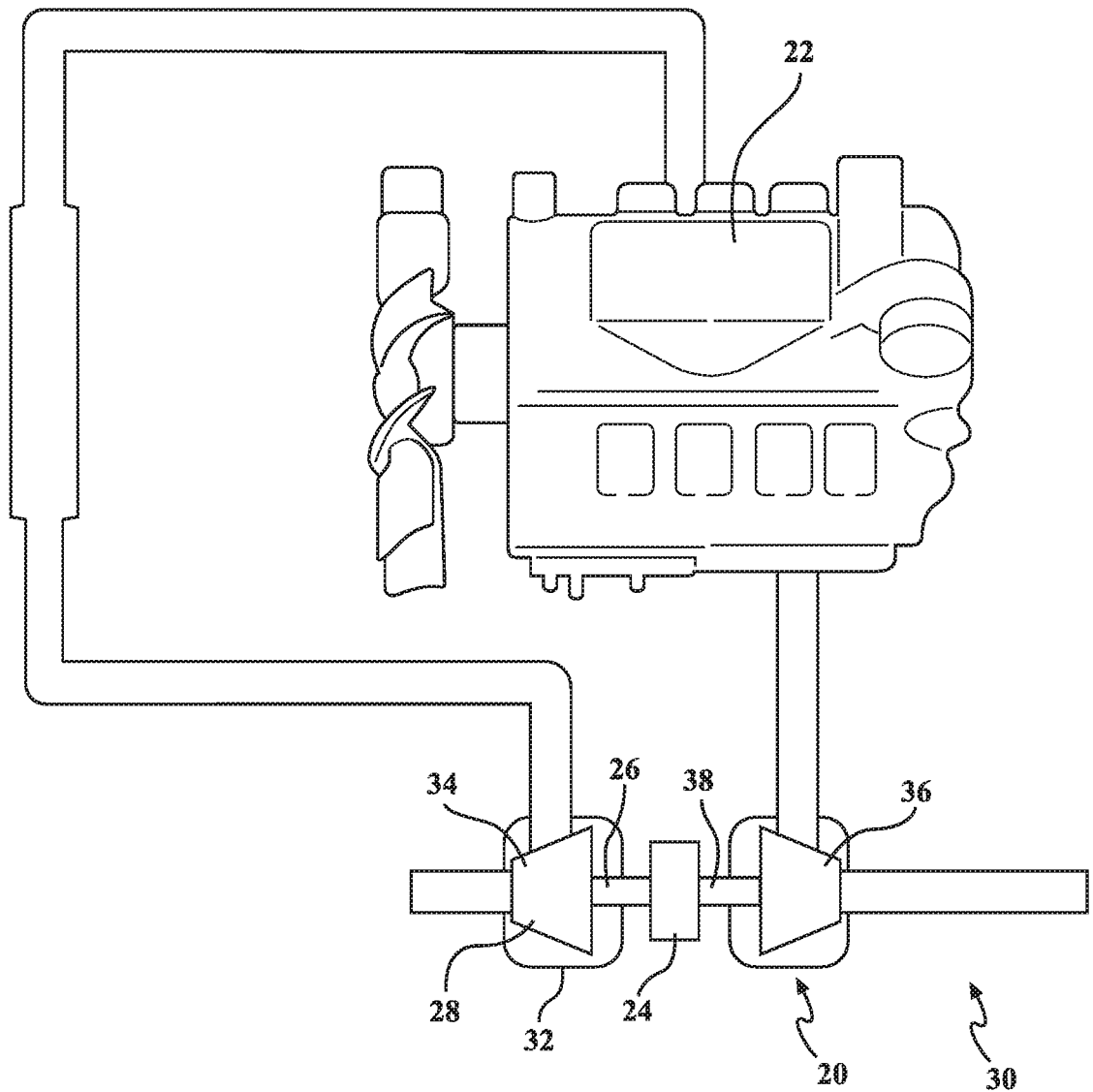
FIG. 5 is a schematic view of the assisted turbocharger system shown in FIG. 1 comprising the motorized forced-induction system and the turbocharger as a single component in use with an engine.
Figure 6:
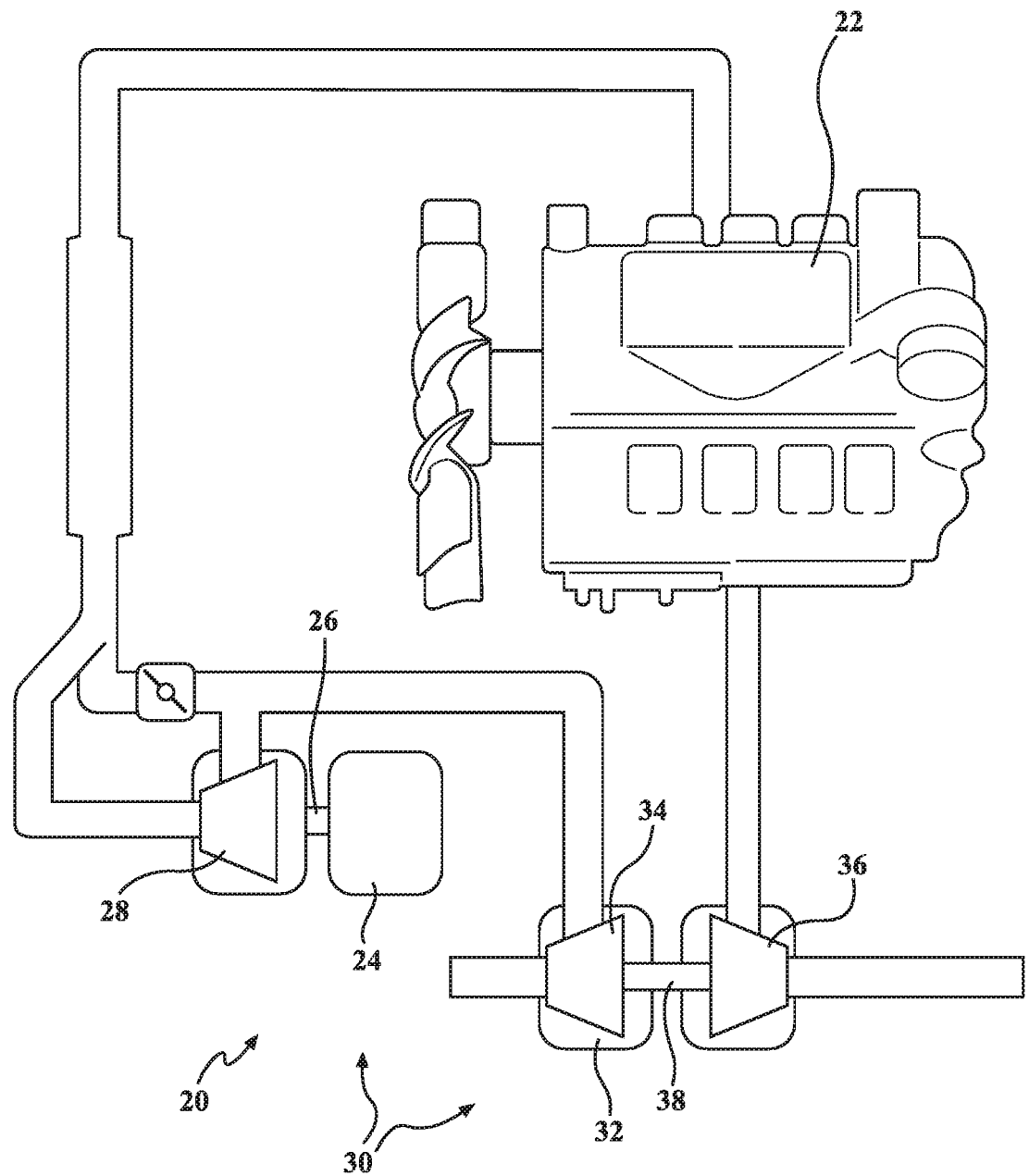
FIG. 6 is a schematic view of the assisted turbocharger system comprising the motorized forced-induction system as shown in FIG. 3 and a turbocharger as separate components in use with an engine.

With reference to the Figures, wherein like numerals indicate like parts throughout the several views, a motorized forced-induction system 20 is generally shown in FIGS. 1-6. The motorized forced-induction system 20 increases the flow of air into an engine 22, as shown in FIGS. 5 and 6. The motorized forced-induction system 20 comprises an electric motor 24, an output shaft 26 coupled to and rotatably driven by the electric motor 24, and a compressor wheel 28 coupled to the output shaft 26 such that the compressor wheel 28 is rotatable with the output shaft 26, as shown in FIGS. 2 and 4. Rotation of the compressor is configured to compress the air flowing into the engine 22. Compressing the air flowing into the engine 22 increases the power output of the engine 22, lowers the fuel consumption of the engine 22, and reduces the emissions produced by the internal combustion engine 22.

As shown in FIGS. 5 and 6, the motorized forced-induction system 20 may be used with an assisted turbocharger system 30. The assisted turbocharger system 30 is used with the engine 22 that receives the air and produces exhaust gases. The assisted turbocharger system 30 is configured to increase the flow of the air into the engine 22 to supplement the flow of the air from a turbocharger 32 to the engine 22.

The assisted turbocharger system 30 comprises the turbocharger 32 configured to receive the exhaust gases from the engine 22 and increase the flow of the air into the engine 22 in proportion to the flow of exhaust gases from the engine 22. As is commonly known in the art, the turbocharger 32 comprises a compressor wheel 34, a turbine wheel 36, and an output shaft 38, with both the compressor wheel 34 and the turbine wheel 36 coupled to the output shaft 38 such that the compressor wheel 34 and the turbine wheel 36 are rotatable with the output shaft 38. The turbine wheel 36 is rotated by the exhaust gases flowing from the engine 22, which also rotates the output shaft 38 and the compressor wheel 34. Rotation of the compressor wheel 34 is configured to compress the air flowing into the engine 22.

In one embodiment, the turbocharger 32 and the motorized forced-induction system 20 are a single component, as shown in FIGS. 1, 2, and 5. Said differently, the motorized forced-induction system 20 may be integrated into the turbocharger 32. In such a configuration, the output shaft 26 of the motorized forced-induction system 20 and the output shaft 38 of the turbocharger 32 are the same component. Furthermore, the compressor wheel 28 of the motorized forced-induction system 20 and the compressor wheel 34 of the turbocharger 32 are the same component. In another embodiment, the turbocharger 32 and the motorized forced-induction system 20 are separate components that are spaced from one another, as shown in FIGS. 3, 4, and 6. Both the turbocharger 32 and the motorized forced-induction system 20 are fluidly coupled to the engine 22 for increasing the flow of air into the engine 22. In either embodiment, the motorized forced-induction system 20 supplements the flow of air from the turbocharger 32 to the engine 22. One example of the motorized forced-induction system 20 supplementing the flow of air from the turbocharger 32 to the engine 22 occurs when the motorized forced-induction system 20 increases air flow to the engine 22 when exhaust gas flow from the engine 22 is substantially slower than the desired airflow into the engine 22. Such a condition occurs when engine RPM is dramatically increased (commonly referred to in the art as "turbo lag"). However, one having skill in the art will appreciate that the motorized forced-induction system 20 may be used to supplement the flow of air from the turbocharger 32 to the engine 22 in any condition when increased airflow is desired. Furthermore, one having skill in the art will appreciate that the motorized forced-induction system 20 may be used in any suitable component(s) and configuration(s) for increasing the flow of air into the engine 22.

As shown in FIGS. 2 and 4, the motorized forced-induction system 20 further comprises an electronics assembly 40 electrically coupled with the electric motor 24 to drive the electric motor 24 to control rotation of the output shaft 26 and the compressor wheel 28. The electronics assembly 40 is configured to receive a coolant fluid for cooling the electronics assembly 40.

Figure 7:
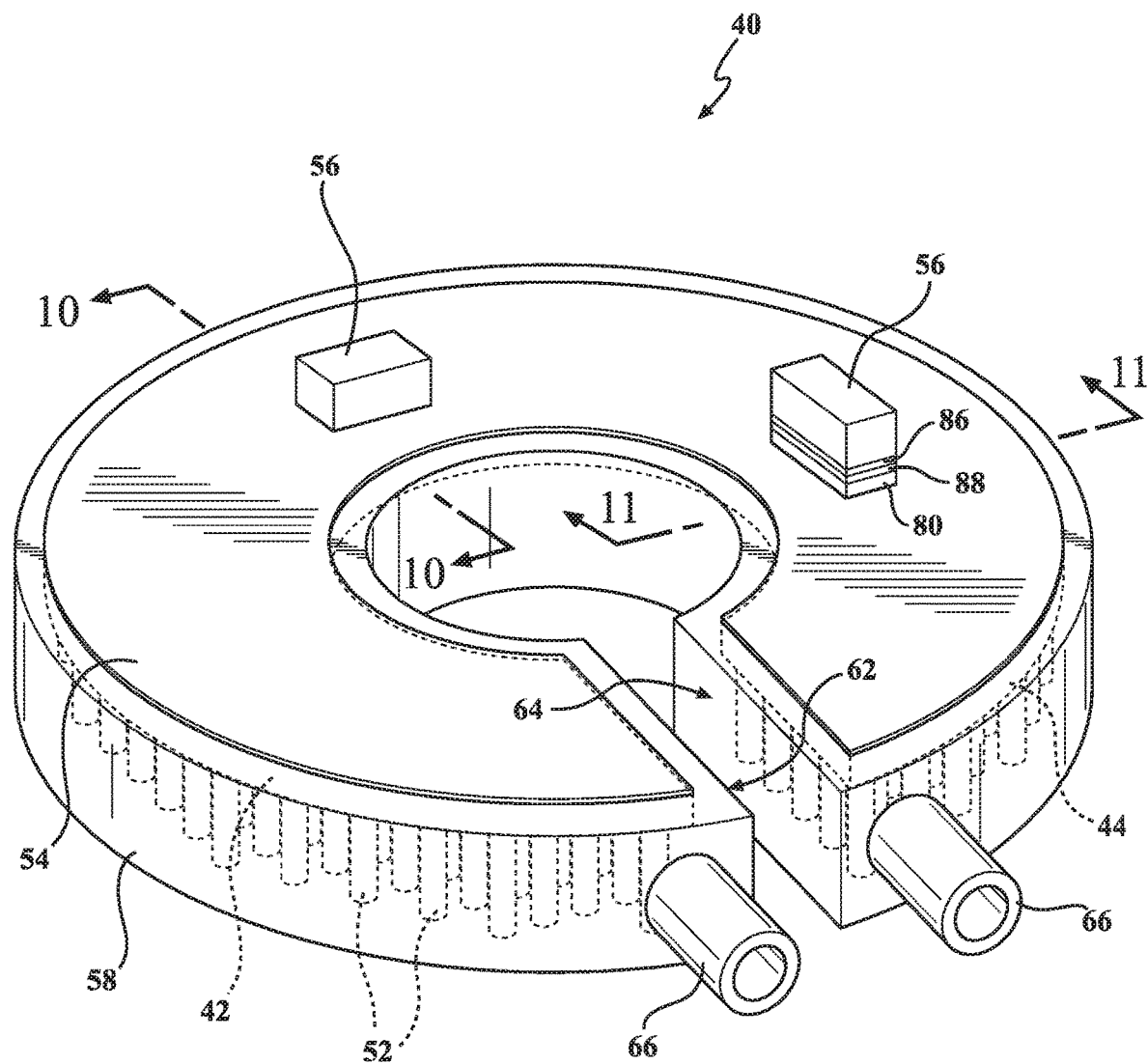
FIG. 7 is a perspective view of an electronics assembly.
Figure 8:
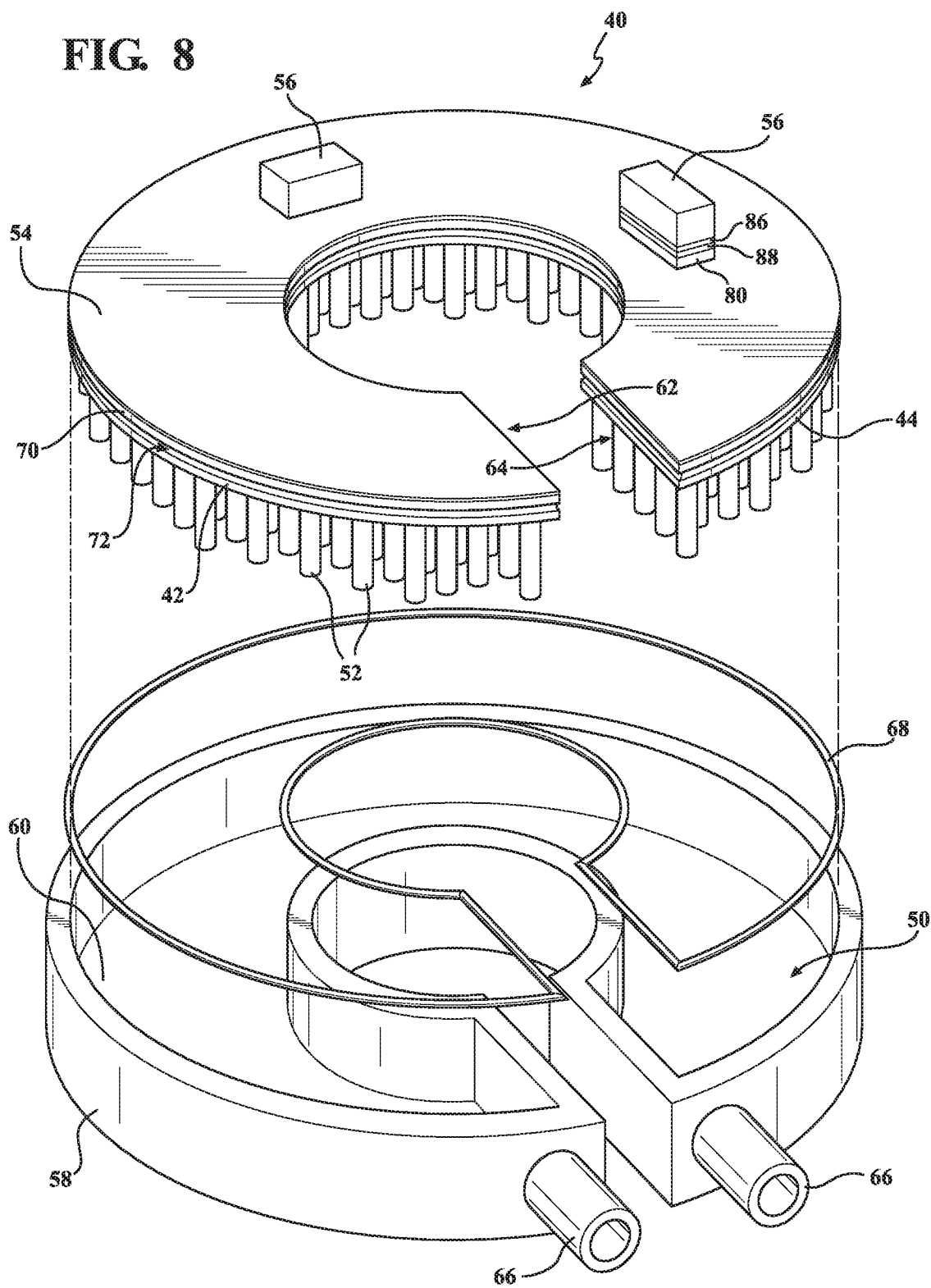
FIG. 8 is a first exploded view of the electronics assembly as shown in FIG. 7.
Figure 9:
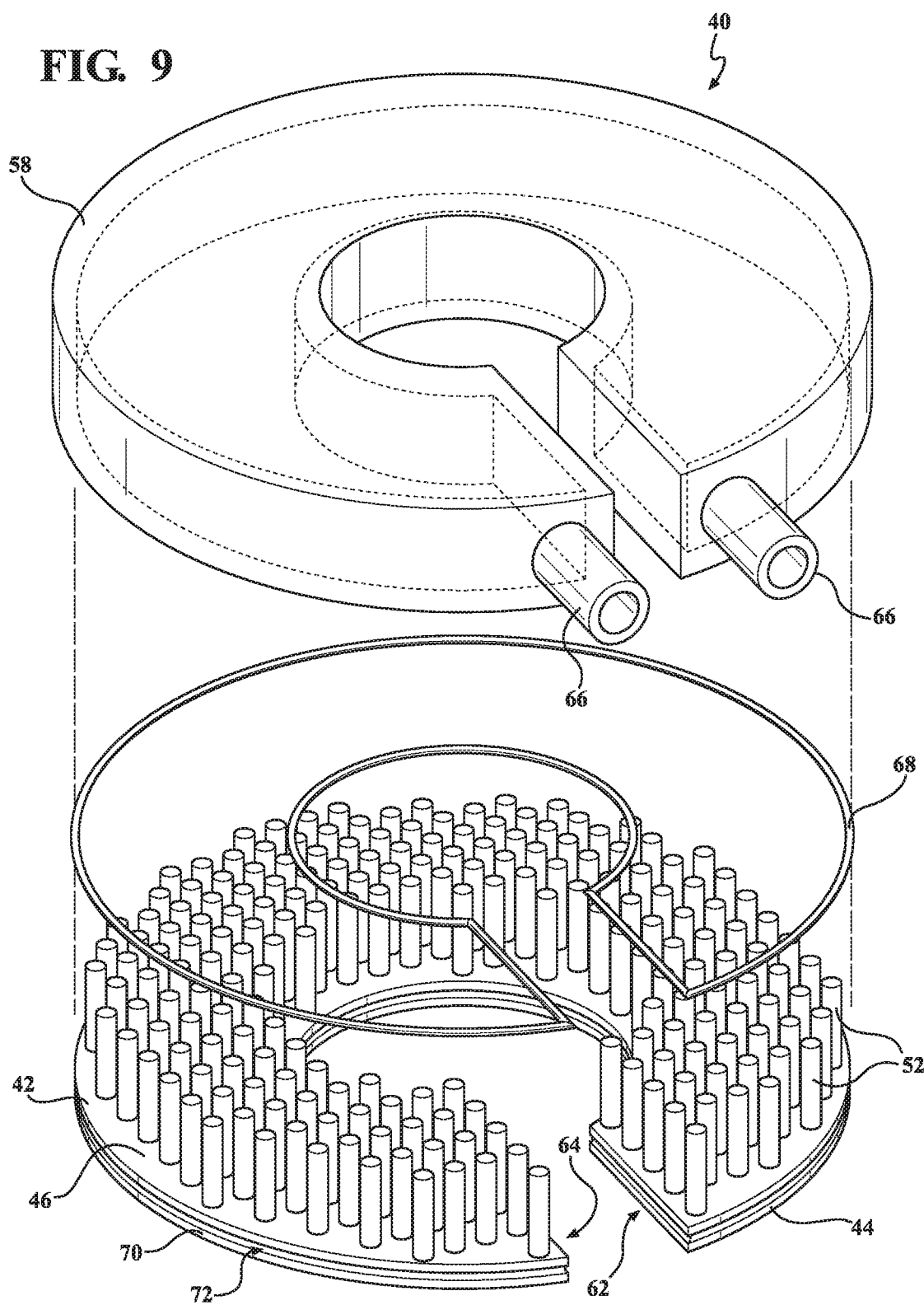
FIG. 9 is a second exploded view of the electronics assembly as shown in FIG. 7.

As shown in FIGS. 7-9, the electronics assembly 40 comprises a heat sink 42 comprising a thermally conductive material. In one embodiment, the thermally conductive material comprises a metal, such as aluminum: however, one having skill in the art will appreciate that the thermally conductive material may be any suitable material capable of transferring heat.

As shown in FIGS. 10A-11B, the heat sink 42 comprises a frame 44 extending between a first surface 46 and a second surface 48. The first surface 46 defines at least a portion of a cavity 50 for receiving the coolant fluid therein. The heat sink 42 further comprises a plurality of cooling members 52 coupled to and extending from the first surface 46 of the frame 44 into the cavity 50. The plurality of cooling members 52 are disposed within the coolant fluid in the cavity 50 and heat can be transferred between the heat sink 42 and the coolant fluid.

The electronics assembly 40 further comprises an electrical insulator 54 directly bonded to the second surface 48 of the frame 44. The electrical insulator 54 is a thermal conductor. The electronics assembly 40 further comprises a semiconductor 56 thermally coupled to the electrical insulator 54 to facilitate heat transfer between the semiconductor 56 and the heat sink 42, with the electrical insulator 54 electrically insulating the semiconductor 56 from the heat sink 42.

The electronics assembly 40 may be used with high-power density electronics, with typical power levels between 1-20 kW. Accordingly, the semiconductor 56 described above may be further defined as a power semiconductor when used with high-power density electronics. The electronics assembly 40 used with high-power density electronics may drive the electric motor 24.

Due to common small packaging requirements of modern day electronics, the high power-density results in increased heat, which must be dissipated to increase electrical efficiency and prevent component failure. As will become apparent in the description below, the electronics assembly 40 of the subject invention improves heat dissipation through the direct bonding of the electrical insulator 54 to the second surface 48 of the frame 44. In particular, the direct bonding reduces thermally insulating air gaps between the electrical insulator 54 and the second surface 48 of the frame 44, which increases the thermal transfer efficiency of the electronics assembly 40. In addition, the direct bonding of the electrical insulator 54 to the second surface 48 of the frame 44 reduces cost and increases throughput by eliminating the need for a separately produced electrically insulating board, which is then mounted to a heat sink with thermal grease therebetween. Furthermore, the direct bonding of the electrical insulator 54 to the second surface 48 of the frame 44 allows for thin layers of the electrical insulator 54, which reduces the size of the electronics assembly 40, improves the packaging characteristics of the electronics assembly 40, and reduces the thermal resistance between the semiconductor 56 and the coolant fluid.

As shown in FIGS. 10A-11B, the first and second surfaces 46, 48 may be disposed opposite one another such that the first and second surfaces 46, 48 face away from one another. The first and second surfaces 46, 48 may be substantially parallel to one another. However, one having skill in the art will appreciate that first and second surfaces 46, 48 may be disposed in non-parallel orientations with the frame 44 extending between the first and second surfaces 46, 48. Furthermore, the first and second surfaces 46, 48 may have planar or non-planar configurations without escaping the scope of the subject invention.

The plurality of cooling members 52 may extend substantially perpendicular to the first surface 46. As shown in FIGS. 7-9, each of the plurality of cooling members 52 may have a cylindrical configuration. Furthermore, the plurality of cooling members 52 may extend from the first surface 46 spaced from and substantially parallel to one another in a grid-like pattern along the first surface 46. As such, the coolant fluid may freely flow around the plurality of cooling members 52, with heat being transferred to the flowing coolant fluid and transported away from the electronics assembly 40.

Furthermore, each of the plurality of cooling members 52 may extend from a proximal end adjacent the first surface 46 to a distal end spaced from the first surface 46, with each of the plurality of cooling members 52 truncating at the distal end. The distal end of each of the plurality of cooling members 52 may be spaced from any thermally conductive surface (such as the heat sink 42 itself or any other components of the electronics assembly 40) to limit unwanted transmission of heat to anything other than the coolant fluid. For example, as shown in FIGS. 10A-11B, the electronics assembly 40 may further comprise a coolant housing 58 coupled to the heat sink 42 and having an internal surface 60, with the internal surface 60 partially defining the cavity 50 for receiving the coolant fluid therein. The plurality of cooling members 52 and the coolant housing 58 may be entirely spaced from one another to limit heat transfer therebetween and enable a more relaxed tolerance on the length of the cooling members 52. Said differently, spacing the distal end of each of the plurality of cooling members 52 from the coolant housing 58 or any thermally conductive surface facilitates efficient heat transfer from the heat sink 42 to the coolant fluid. One having skill in the art will appreciate that the spacing between the plurality of cooling members 52 and the coolant housing 58 should be sized to prevent flow of the coolant fluid between the plurality of cooling members 52 and the coolant housing 58 rather than around the cooling members 52. One having skill in the art will appreciate the plurality of cooling members 52 may have any suitable shape, size, and configuration for facilitating heat transfer to the coolant fluid.

The first surface 46 of the frame 44 of the heat sink 42 may have a substantially planar configuration, with the heat sink 42 covering the coolant housing 58 to define the cavity 50 with the heat sink 42 is coupled with the coolant housing 58.

As shown in FIGS. 7-9, the electronics assembly 40 may have a partially annular configuration to surround the output shaft 26 of the motorized forced-induction system 20. Said differently, the electronics assembly 40 may be curved between a first end 62 and a second end 64 opposite the first end 62. The electronics assembly 40 may have a port 66 at each of the first and second ends 62, 64. Each of the ports 66 open into the cavity 50 defined by the heat sink 42 (and the coolant housing 58 when present) and facilitate flow of the coolant fluid into and out of the cavity 50. More specifically, one of the ports 66 may be an inlet port through which the coolant fluid enters the cavity 50 and the other one of the ports 66 may be an outlet port through with the coolant fluid exits the cavity 50. As such, the coolant fluid flows through the cavity 50 in a single direction between the first and second ends 62, 64 to facilitate movement of the heated coolant fluid away from the electronics assembly 40. One having skill in the art will appreciate that the heat sink 42 and the coolant housing 58 may have any suitable shape, size, and configuration for facilitating heat transfer from the heat sink 42 to the coolant fluid, and flow of the coolant fluid away from the electronics assembly 40.

As shown in FIGS. 10A-11B, the electronics assembly 40 may further comprise a sealing member 68 compressed between the heat sink 42 and the coolant housing 58 for preventing the coolant fluid from leaking between the heat sink 42 and the coolant housing 58. Said differently, the sealing member 68 may occupy the gap between the heat sink 42 and the coolant housing 58 to prevent the coolant fluid from leaking between the heat sink 42 and the coolant housing 58.

The coolant housing 58 may have a perimeter wall 70 at least partially surrounding the frame 44 of the heat sink 42, with the sealing member 68 compressed between the frame 44 of the heat sink 42 and the perimeter wall 70 of the coolant housing 58. In one embodiment, one of the heat sink 42 and the coolant housing 58 may define a recess 72 for receiving the sealing member 68 therein. Furthermore, the recess 72 positions and retains the sealing element to ensure engagement between the heat sink 42 and the coolant housing 58 along the entire perimeter wall 70.

In the embodiment shown in FIGS. 7-9, the sealing member 68 is further defined as an O-ring. More specifically, the O-ring may have a circular cross-section. However, the sealing member 68 may have any suitable shape that prevents the coolant fluid from leaking between the heat sink 42 and the coolant housing 58.

The sealing member 68 may be comprised of an elastomer capable of compressing between and sealing between the heat sink 42 and the coolant housing 58; however, any suitable material may be used to seal between the heat sink 42 and the coolant housing 58.

Although not shown in the Figures, the first surface 46 of the frame 44 may fully define the cavity 50 such that the heat sink 42 itself fully defines the cavity 50 (i.e., the electronics assembly 40 may not comprise a coolant housing). Said differently, the cavity 50 may be defined within the frame 44 of the heat sink 42 itself, with the first surface 46 defining the entire perimeter of the cavity 50. One having skill in the art will appreciate that the electronics assembly 40 may comprise any number of components that fully or partially define the cavity 50 for accepting the coolant fluid.

As shown in FIGS. 10A-11B, the electrical insulator 54 may have an engagement surface 74 abutting the second surface 48 of the frame 44; with the electrical insulator 54 directly bonded to the second surface 48 entirely along the engagement surface 74. Said differently, the electrical insulator 54 may lay along the second surface 48, with the engagement surface 74 of the electrical insulator 54 directly bonded to the entire portion of the second surface 48 that the electrical insulator 54 lies along. As such, the electrical insulator 54 coats the second surface 48 of the frame 44. The direct bonding of the electrical insulator 54 to the second surface 48 of the frame 44 entirely along the engagement surface 74 substantially eliminates air gaps between electrical insulator 54 and the frame 44 of the heat sink 42. Said differently, the air gaps between the electrical insulator 54 and the frame 44 of the heat sink 42 are so small that they are only visible at the atomic level. The presence of air gaps inhibit heat transfer between two adjacent thermally conductive materials. The substantial elimination of air gaps between the electrical insulator 54 and the frame 44 of the heat sink 42 facilitates efficient heat transfer between the electrical insulator 54 and the frame 44 of the heat sink 42. Furthermore, substantial elimination of air gaps between the electrical insulator 54 and the frame 44 of the heat sink 42 eliminates the need for a thermal grease therebetween (to fill the air gaps with thermally conductive material), which is commonly performed in the art.

As shown in FIGS. 7, 8, and 10A-11B, the electrical insulator 54 may extend along the entire second surface 48 of the frame 44; however, the electrical insulator 54 may extend along a portion or several portions of the second surface 48 of the frame 44.

The electrical insulator 54, as its name implies, electrically insulates the semiconductor 56 from the heat sink 42 in order to prevent an electrical short between the semiconductor 56 and the heat sink 42. Furthermore, the electrical insulator 54 is also a thermal conductor that facilitates heat transfer from the semiconductor 56 (which heats up during operation) to the heat sink 42, which transfers heat to the coolant fluid as described above.

The electrical insulator 54 may comprise at least one of an oxide and a nitride. Oxides and nitrides have desired thermal conduction and electrical insulation properties that promote their use with the electrical insulator 54. Examples of suitable oxides/nitrides include (but are not limited to): aluminum oxide, aluminum nitride, boron nitride, magnesium oxide, and silicon oxide. However, one having skill in the art will appreciate that the electrical insulator 54 may comprise any material that is a thermal conductor and an electrical insulator 54.

Figure 10A:
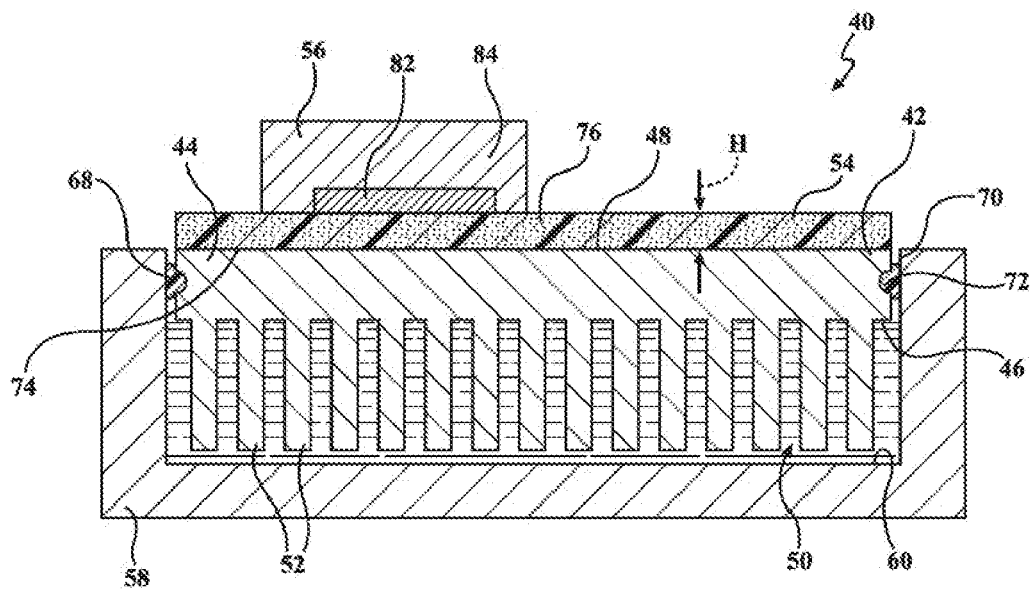
FIG. 10A is a cross-sectional view of the electronics assembly shown in FIG. 7 taken along line 10-10 showing a passivation layer.
Figure 11A:
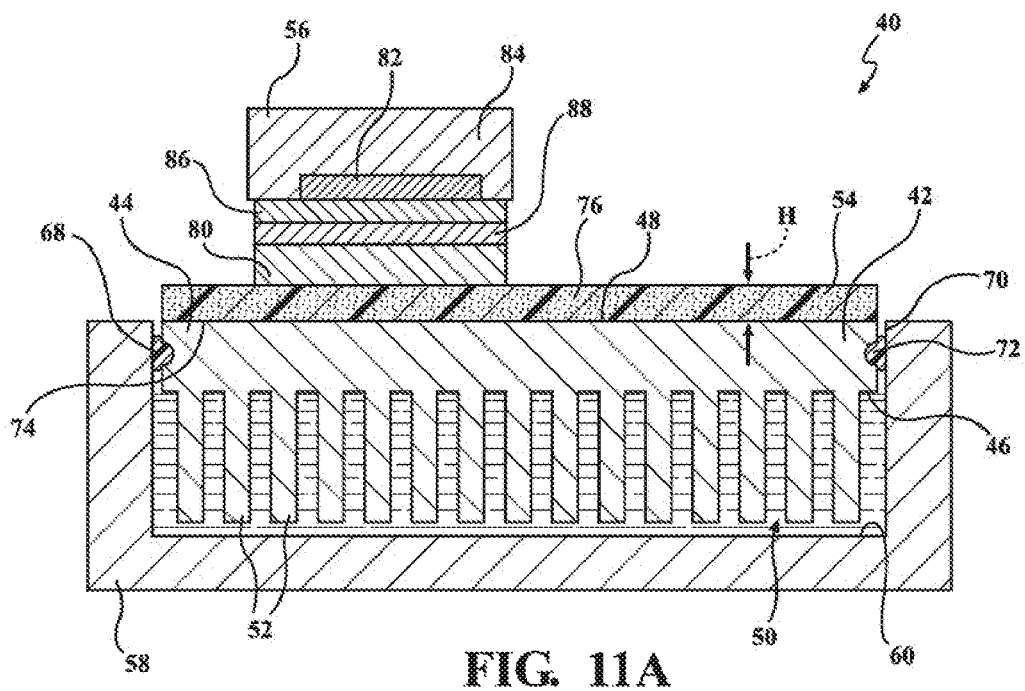
FIG. 11A is a cross-sectional view of the electronics assembly shown in FIG. 7 taken along line 11-11 showing a passivation layer.

As shown in FIGS. 10A and 11A, the electrical insulator 54 may comprise a passivation layer 76 directly bonded to the second surface 48 of the frame 44 and comprised of the at least one of the oxide and the nitride. As will be understood by one having skill in the art, passivation refers to a material becoming "passive," that is, less affected or corroded by the environment of future use. Passivation involves creation of an outer layer of shield material that is applied as a microcoating, created by chemical reaction with the base material, or allowed to build from spontaneous oxidation in the air. As described above, the heat sink 42 comprises a metal, such as aluminum. Therefore, in one embodiment when the passivation layer 76 is comprised of the oxide, the passivation layer 76 may be applied to the second surface 48 of the frame 44 by an anodizing process. Furthermore, in one embodiment when the passivation layer 76 is comprised of the nitride, the passivation layer 76 may be applied to the second surface 48 of the frame 44 by a nitriding process.

Figure 10B:
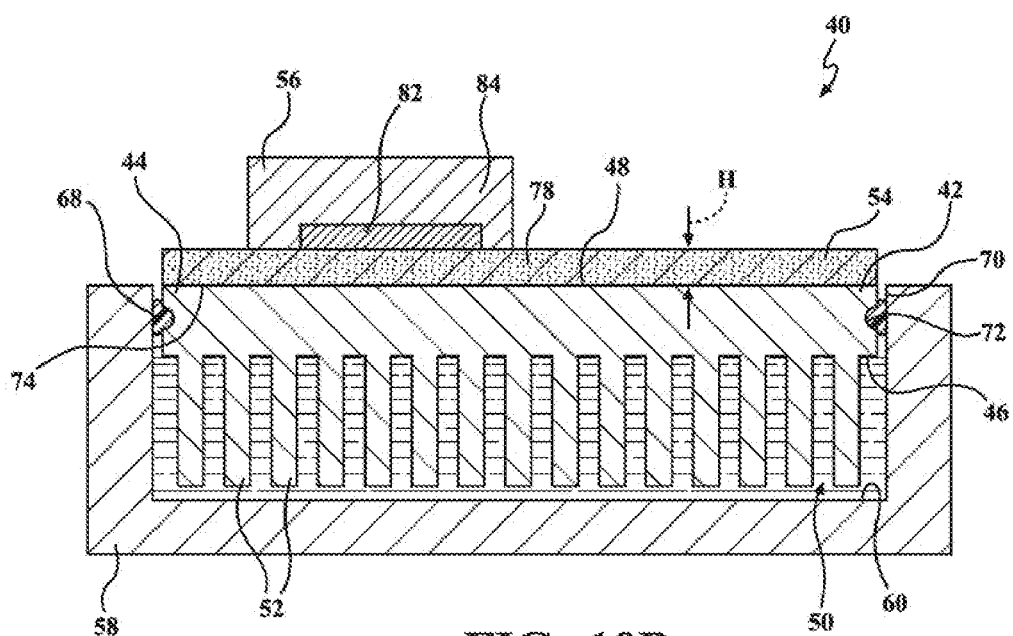
FIG. 10B is a cross-sectional view of the electronics assembly shown in FIG. 7 taken along line 10-10 showing a composite coating.
Figure 11B:
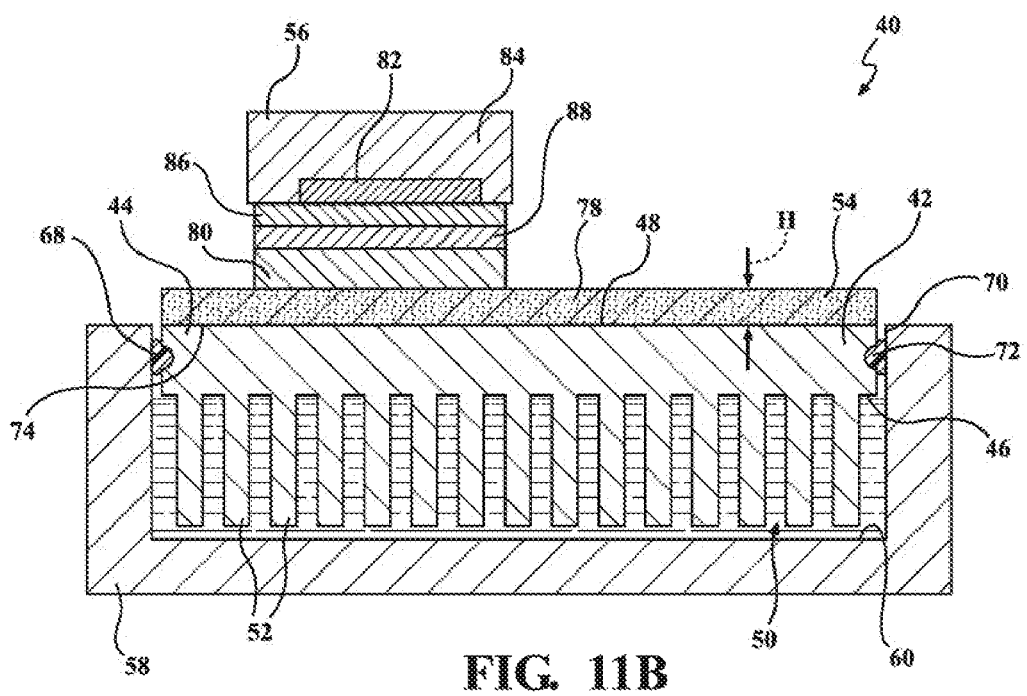
FIG. 11B is a cross-sectional view of the electronics assembly shown in FIG. 7 taken along line 11-11 showing a composite coating.

As shown in FIGS. 10B and 11B, the electrical insulator 54 may further comprise a polymer, with the at least one of the oxide and the nitride dispersed within the polymer. Said differently, the polymer may act as a matrix, with oxide and/or nitride that is atomized (e.g., fine particles or granules) dispersed within and held in place by the polymer. The atomized particles of the oxide and/or the nitride are in close proximity with each other to facilitate heat transfer between the particles from the semiconductor 56 to the heat sink 42. The polymer may be thermally conductive to promote heat transfer between the particles of the oxide and/or nitride. The polymer may have a working temperature range suitable for the application: for example, between −55 degree C.+180 degree C. The polymer may be resistant to chemicals which may be found in the application, which may come from the electronics manufacturing process (such as solder flux) or from the motorized forced-induction system 20 (e.g. oil). Non-limiting examples of the polymer include polyetheretherketone (PEEK), polybutylterephthalalate (PBT), polyphenyl sulphide (PPS), liquid crystal polymer (LCP), and polyamide 46 (PA46). However, one having skill in the art will appreciate that the polymer may be any suitable material for dispersing the oxide and/or the nitride therein.

Furthermore, the electrical insulator 54 may comprise a composite coating 78 directly bonded to the second surface 48 of the frame 44 and comprised of the polymer and the at least one of the oxide and the nitride dispersed within the polymer. The composite coating 78 may be applied to the second surface 48 of the frame 44 by any suitable process, including (but not limited to): spraying, roll-on transfer, dipping, and vapor deposition.

As shown in FIGS. 10A-11B, the electrical insulator 54 may extend from the second surface 48 of the frame 44 a height H of 100 microns or less. Said differently, the electrical insulator 54 is disposed as a thin layer along the second surface 48, which reduces material cost and the weight of the electronics assembly 40 while providing thermal conductivity and electrical insulation properties. The dimensions of the electrical insulator 54 shown in FIGS. 7, 8, and 10A-11B have been exaggerated to better show details of the electrical insulator 54. One having skill in the art will appreciate that the electrical insulator 54 may extend from the second surface 48 of the frame 44 any suitable height H while maintaining the desired thermal conductivity and electrical insulation properties.

As shown in FIGS. 10A and 10B, the semiconductor 56 may be directly coupled to the electrical insulator 54. More specifically, the semiconductor 56 may directly abut the electrical insulator 54, with heat from the semiconductor 56 directly transferring to the electrical insulator 54. Alternatively, a bonding agent (such as a solder, an adhesive, etc.) may be disposed between the semiconductor 56 and the electrical insulator 54 to bond the semiconductor 56 to the electrical insulator 54.

As yet another alternative, the electronics assembly 40 may further comprise a conductive layer 80 between the electrical insulator 54 and the semiconductor 56, as shown in FIGS. 11A and 11B. The conductive layer 80 conducts heat between the semiconductor 56 and the electrical insulator 54. Furthermore, the conductive layer 80 is electrically coupled to the semiconductor 56 for facilitating electrical transmission between the semiconductor 56 and the electric motor 24. Said differently, the conductive layer 80 may be a circuit that electrically couples the semiconductor 56 with other electric and/or electronic component(s).

The conductive layer 80 may be directly bonded to the electrical insulator 54. Furthermore, the conductive layer 80 may comprise a copper alloy. In one embodiment, the conductive layer 80 is bonded to electrical insulator 54 by copper cold gas spray deposition. In another embodiment, the conductive layer 80 is bonded to electrical insulator 54 by printing on the electrical insulator 54 (i.e., the conductive layer 80 is formed by a thin layer of material deposited, or "printed," on the surface of the electrical insulator 54). Alternatively, the conductive layer 80 may be bonded to electrical insulator 54 by lamination. However, the conductive layer 80 may be directly bonded to the electrical insulator 54 by any suitable process or method. Furthermore, one having skill in the art will appreciate that any suitable material having desired thermal and the electrical conduction qualities may be used in place of the copper alloy.

The semiconductor 56 may be completely comprised of a semiconductive material. Alternatively, the semiconductor 56 may be by comprised of a plurality of materials, with at least one of the materials comprised of the semiconductive material. For example, as shown in FIGS. 10A-11B, the semiconductor 56 comprises a semiconductor die 82 and a semiconductor package 84 at least partially encapsulating the semiconductor die 82. The semiconductor die 82 comprises the semiconductive material. The semiconductor package 84 comprises an electrically insulating material. The semiconductor package 84 encapsulates the semiconductor die 82 in such a way so as to only expose the semiconductor die 82 to the electrical insulator 54 (or components therebetween, such as the conductive layer 80) and prevent degradation of the semiconductor die 82 by the environment. As such, the semiconductor package 84 prevents an electrical short between the semiconductor die 82 and other components outside, but in proximity of, the electronics assembly 40.

One having skill in the art will appreciate that additional layers may be disposed between the semiconductor 56 and the electrical insulator 54. For example, the electronics assembly 40 may further comprise a thermal pad 86 which may be disposed between the semiconductor 56 and the electrical insulator 54. As shown in FIGS. 11A and 11B, the thermal pad 86 may directly abut the semiconductor 56. The thermal pad 86 may be comprised of a metallic material (such as a copper alloy) or any other material that is both thermally and electrically conductive.

As another example, the electronics assembly 40 may further comprise a solder 88 between the semiconductor 56 and the electrical insulator 54 to fix the semiconductor 56 to the electrical insulator 54 and facilitate thermal conductivity between the semiconductor 56 and the electrical insulator 54. As shown in FIGS. 11A and 11B, the solder 88 may be disposed between the thermal pad 86 and the conductive layer 80, and fixes the semiconductor 56 and the thermal pad 86 with the electrical insulator 54 and the conductive layer 80. However, the solder 88 may be disposed anywhere between the semiconductor 56 and the electrical insulator 54 for facilitating fixing the semiconductor 56 to the electrical insulator 54 and thermal conductivity between the semiconductor 56 and the electrical insulator 54. The solder 88 may be at least partially comprised of tin or any other suitable material that facilitates thermal conductivity, electrical conductivity, and bonding between components.

Similar to the electrical insulator 54 described above, the dimensions of the thermal pad 86 and the solder 88 shown in FIGS. 2, 4, 7, 8, 11A, and 11B have been exaggerated to better show details of the thermal pad 86 and the solder 88.

FIGS. 2, 4, 7, and 8 show the electronics assembly 40 having two semiconductors 56. This configuration is demonstrative in nature and is used to show both a semiconductor 56 directly bonded to an electrical insulator 54 and a semiconductor 56 bonded to an electrical insulator with a conductive layer 80, a thermal pad 86, and a solder 88 therebetween. One having skill in the art will appreciate that the electronics assembly 40 may any number of semiconductors 56 positioned in any layout along the electrical insulator 54 with any number of and combination of components between the semiconductor 56 and the electrical insulator 54 without escaping the scope of the subject invention. Furthermore, the electronics assembly 40 may include other electronic components (such as resistors, capacitors, inductors, etc.) without escaping the scope of the subject invention.

The invention has been described in an illustrative manner, and it is to be understood that the terminology which has been used is intended to be in the nature of words of description rather than of limitation. As is now apparent to those skilled in the art, many modifications and variations of the subject invention are possible in light of the above teachings. It is, therefore, to be understood that within the scope of the appended claims, wherein reference numerals are merely for convenience and are not to be in any way limiting, the invention may be practiced otherwise than as specifically described.

What is claimed is:

1. An electronics assembly for driving an electric motor and configured to receive a coolant fluid for cooling the electronics assembly, said electronics assembly comprising:
   a heat sink comprising a thermally conductive material, and further comprising:
      a C-shaped frame having first and second ends that are facing each other, a first port provided proximate to the first end that is configured to allow the coolant fluid to enter the heat sink, and a second port provided proximate to the second end that is configured to allow the coolant fluid to exit the heat sink, the frame extending between a first surface and a second surface, wherein said first surface defines at least a portion of a cavity for receiving the coolant fluid therein; and
      a plurality of cooling members coupled to and extending from said first surface of said frame into said cavity such that said plurality of cooling members are disposed within the coolant fluid in said cavity and heat can be transferred between said heat sink and the coolant fluid;
   an electrical insulator directly bonded to said second surface of said frame, wherein said electrical insulator is a thermal conductor; and
   a semiconductor thermally coupled to said electrical insulator to facilitate heat transfer between said semiconductor and said heat sink, with said electrical insulator electrically insulating said semiconductor from said heat sink,
   wherein said electrical insulator has an engagement surface abutting said second surface of said frame, with said electrical insulator directly bonded to said second surface entirely along said engagement surface and said second surface of said frame.

2. The electronics assembly as set forth in claim 1, wherein said electrical insulator comprises at least one of an oxide and a nitride.

3. The electronics assembly as set forth in claim 2, wherein said electrical insulator comprises a passivation layer directly bonded to said second surface of said frame and comprised of said at least one of said oxide and said nitride.

4. The electronics assembly as set forth in claim 2, wherein said electrical insulator comprises a polymer with said at least one of said oxide and said nitride dispersed within said polymer.

5. The electronics assembly as set forth in claim 4, wherein said electrical insulator comprises a composite coating directly bonded to said second surface of said frame and comprised of said polymer and said at least one of said oxide and said nitride dispersed within said polymer.

6. The electronics assembly as set forth in claim 1, wherein said electrical insulator extends from said second surface of said frame a height of 100 microns or less.

7. The electronics assembly as set forth in claim 1, further comprising a conductive layer between said electrical insulator and said semiconductor, with said conductive layer conducting the heat between said semiconductor and said electrical insulator, and with said conductive layer electrically coupled to said semiconductor for facilitating electrical transmission between said semiconductor and the electric motor.

8. The electronics assembly as set forth in claim 7, wherein said conductive layer is directly bonded to said electrical insulator.

9. The electronics assembly as set forth in claim 7, wherein said conductive layer comprises a copper alloy.

10. The electronics assembly as set forth in claim 1, wherein said first and second surfaces are disposed opposite one another such that said first and second surfaces face away from one another.

11. The electronics assembly as set forth in claim 1, wherein said first and second surfaces are substantially parallel to one another.

12. The electronics assembly as set forth in claim 1, wherein said plurality of cooling members extends substantially perpendicular to said first surface.

13. The electronics assembly as set forth in claim 1, further comprising a coolant housing coupled to said heat sink and having an internal surface, with said internal surface partially defining said cavity for receiving the coolant fluid therein.

14. The electronics assembly as set forth in claim 13, wherein said plurality of cooling members and said coolant housing are entirely spaced from one another to limit heat transfer therebetween.

15. The electronics assembly as set forth in claim 13, further comprising a sealing member compressed between said heat sink and said coolant housing for preventing the coolant fluid from leaking between said heat sink and said coolant housing.

16. The electronics assembly as set forth in claim 15, wherein said sealing member is further defined as an O-ring.

17. The electronics assembly as set forth in claim 15, wherein said coolant housing has a perimeter wall at least partially surrounding said frame of said heat sink, with said sealing member compressed between said frame of said heat sink and said perimeter wall of said coolant housing.

18. The electronics assembly as set forth in claim 1, further comprising a solder between said semiconductor and said electrical insulator to fix said semiconductor to said electrical insulator and facilitate thermal conduction between said semiconductor and said electrical insulator.

19. The electronics assembly as set forth in claim 1, wherein said semiconductor is directly coupled to said electrical insulator.

20. A motorized forced-induction system for increasing flow of air into an engine; said forced-induction system comprising:
an electric motor;
an output shaft coupled to and rotatably driven by said electric motor;
a compressor wheel coupled to the output shaft such that the compressor wheel is rotatable with said output shaft, and wherein a rotation of the compressor wheel is configured to compress the air flowing into the engine; and
an electronics assembly electrically coupled with said electric motor to drive said electric motor to control a rotation of said output shaft and the rotation of the compressor wheel, and configured to receive a coolant fluid for cooling said electronics assembly, said electronics assembly comprising:
a heat sink comprising a thermally conductive material, and further comprising:
a C-shaped frame configured to surround the output shaft, the frame extending between a first surface and a second surface, wherein said first surface defines at least a portion of a cavity for receiving the coolant fluid therein; and
a plurality of cooling members coupled to and extending from said first surface of said frame into said cavity such that said plurality of cooling members are disposed within the coolant fluid in said cavity and heat can be transferred between said heat sink and the coolant fluid;
an electrical insulator directly bonded to said second surface of said frame, wherein said electrical insulator is a thermal conductor; and
a semiconductor thermally coupled to said electrical insulator to facilitate heat transfer between said semiconductor and said heat sink, with said electrical insulator electrically insulating said semiconductor from said heat sink, wherein said electrical insulator has an engagement surface abutting said second surface of said frame, with said electrical insulator directly bonded to said second surface entirely along said engagement surface and said second surface of said frame.

21. An assisted turbocharger system for use with an engine that receives air and produces exhaust gases, said assisted turbocharger system comprising:
a turbocharger configured to receive the exhaust gases from the engine and increase a flow of the air into said engine in proportion to a flow of the exhaust gases from the engine; and
said motorized forced-induction system as set forth in claim 20, with said motorized forced-induction system configured to increase the flow of the air into the engine to supplement the flow of the air from the turbocharger to the engine.

22. The assisted turbocharger system as set forth in claim 21, wherein said turbocharger and said motorized forced-induction system are a single component.

23. The assisted turbocharger system as set forth in claim 21, wherein said turbocharger and said motorized forced-induction system are separate components that are spaced from one another.

24. An electronics assembly for driving an electric motor and configured to receive a coolant fluid for cooling the electronics assembly, said electronics assembly comprising:
a heat sink comprising a thermally conductive material, and further comprising:
a C-shaped frame configured to surround a shaft driven by the electric motor, the frame extending between a first surface and a second surface, wherein said first surface defines at least a portion of a cavity for receiving the coolant fluid therein; and a plurality of cooling members coupled to and extending from said first surface of said frame into said cavity such that said plurality of cooling members are disposed within the coolant fluid in said cavity and heat can be transferred between said heat sink and the coolant fluid;

an electrical insulator directly bonded to said second surface of said frame, wherein said electrical insulator is a thermal conductor; and a semiconductor thermally coupled to said electrical insulator to facilitate heat transfer between said semiconductor and said heat sink, with said electrical insulator electrically insulating said semiconductor from said heat sink;

wherein said electrical insulator has an engagement surface abutting said second surface of said frame, with said electrical insulator directly bonded to said second surface entirely along said engagement surface and said second surface of said frame; and wherein said electrical insulator comprises at least one of an oxide and a nitride.

* * * * *